US006972643B2

United States Patent
(12) United States Patent
Tsunekawa et al.

(10) Patent No.: US 6,972,643 B2
(45) Date of Patent: Dec. 6, 2005

(54) SURFACE ACOUSTIC WAVE FILTER

(75) Inventors: Akio Tsunekawa, Osaka (JP); Shunichi Seki, Hyogo (JP); Shinobu Nakaya, Osaka (JP); Hiroyuki Nakamura, Osaka (JP); Toru Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 10/362,903

(22) PCT Filed: Jun. 26, 2002

(86) PCT No.: PCT/JP02/06434

§ 371 (c)(1),
(2), (4) Date: Aug. 11, 2003

(87) PCT Pub. No.: WO03/003574

PCT Pub. Date: Jan. 9, 2003

(65) Prior Publication Data

US 2004/0108918 A1 Jun. 10, 2004

(30) Foreign Application Priority Data

Jun. 29, 2001 (JP) ............................ 2001-198192

(51) Int. Cl.$^{7}$ ................................................ H03H 9/64
(52) U.S. Cl. ................................. 333/195; 310/313 D
(58) Field of Search ................................ 333/193–196, 333/133; 310/313 B, 313 D

(56) References Cited

U.S. PATENT DOCUMENTS 5,835,990 A 11/1998 Saw et al. .............. 310/313 D
6,420,946 B1 * 7/2002 Bauer et al. ................ 333/193
6,583,691 B2 * 6/2003 Takamine .................. 333/195
6,762,657 B2 * 7/2004 Takamine .................. 333/193

FOREIGN PATENT DOCUMENTS

| | | |
|---|---|---|
| JP | 5-267990 | 10/1993 |
| JP | 8-250969 | 9/1996 |
| JP | 2002-9587 | 1/2002 |
| JP | 2002-9588 | 1/2002 |
| JP | 2002-204139 | 7/2002 |
| WO | WO 00/69069 | 11/2000 |

OTHER PUBLICATIONS

International Search Report corresponding to application No. PCT/JP02/06434 dated Oct. 8, 2002.
English translation of Form PCT/ISA/210, dated Oct. 8, 2002.

* cited by examiner

*Primary Examiner*—Barbara Summons
(74) *Attorney, Agent, or Firm*—RatnerPrestia

(57) ABSTRACT

A longitudinally coupled surface acoustic wave filter includes a first, second and third IDT electrodes and a first and second reflector electrodes on a piezoelectric substrate. The IDT electrodes each include a primary excitation region having λ/2 electrode finger pitches, where λ is the wavelength of a surface acoustic wave. The primary excitation region is phase-shifted by a certain amount in accordance with a desired passband frequency response. The IDT electrodes further include a plurality of secondary excitation regions each having electrode finger pitches different from the λ/2 pitches. All of the electrode finger pitches of the surface acoustic wave filter thus range from 0.8λ/2 to 1.2λ/2, so that a loss increase caused by discontinuity between the IDT electrodes is prevented.

10 Claims, 15 Drawing Sheets

SURFACE ACOUSTIC WAVE FILTER

This application is a U.S. National Phase Application of PCT International Application PCT/JP02/06434.

TECHNICAL FIELD

The present invention relates to longitudinally coupled surface acoustic wave filters each delivering low-loss performance.

BACKGROUND ART

To obtain a desired frequency response, a surface acoustic wave filter is widely used among mobile communication apparatuses. The surface acoustic wave filters used in the RF stage, in particular, include a ladder filter having resonators connected in a ladder configuration and a longitudinal mode filter utilizing a mode through acoustic coupling. Since loss of the filter in the RF stage directly affects sensitivity of the mobile communication apparatus, low-loss performance is demanded of the filter. Moreover, semiconductor device such as an IC has become adopting balanced input/output in recent years for noise reduction, thus requiring the surface acoustic wave filter used in the RF stage to be balanced accordingly.

A description is hereinafter provided of a conventional longitudinally coupled surface acoustic wave filter having a balanced input/output port.

FIG. 12 illustrates the conventional longitudinal mode surface acoustic wave filter.

In FIG. 12, the surface acoustic wave filter includes first, second and third interdigital transducer electrodes (hereinafter referred to as IDT electrodes) 1202, 1203, 1204 and first and second reflector electrodes 1205, 1206 on piezoelectric substrate 1201.

First IDT electrode 1202 has upper electrode fingers coupled to first terminal 1207 of the balanced port, and lower electrode fingers coupled to second terminal 1208 of the balanced port.

Second and third IDT electrodes 1203, 1204 each have, on the same side, electrode fingers coupled to unbalanced port 1209, and electrode fingers on the other side of these IDT electrodes 1203, 1204 are grounded. By having the structure described above, the surface acoustic wave filter obtained has the unbalanced and balanced ports.

In the above-described surface acoustic wave filter, a difference between resonance frequencies of primary and tertiary modes is used for securing a pass bandwidth for the filter. To obtain broadband characteristics, it is known that a spacing between first IDT electrode 1202 and each of second and third IDT electrodes 1203, 1204 is deviated substantially by λ/4 from a periodic structure. FIG. 12 illustrates the structure in which the spacing is deviated by +λ/4.

With this structure, however, piezoelectric substrate 1201 has a large free surface portion between the IDT electrodes due to the increased spacing between first IDT electrode 1202 and each of second and third IDT electrodes 1203, 1204, thereby causing propagation loss which results in increased filter loss. Known measures taken against this problem include a structure such as shown in FIG. 13 in which the area of the free surface portion of piezoelectric substrate 1201 is reduced by means of metal electrodes 1301, 1302 or the like.

Japanese Patent Unexamined Publication No. H05-267990 discloses a structure having a λ/4 spacing between centers of the respective adjacent electrode fingers of first and second IDT electrodes 1202, 1203. In other words, this structure has a deviating amount of −λ/4 and as shown in FIG. 14, includes part 1401 connecting the respective adjacent electrode fingers of first and second IDT electrodes 1202, 1203 and part 1402 connecting the respective adjacent electrode fingers of first and third IDT electrodes 1202, 1204. In this structure, the upper electrode fingers of first IDT electrode 1202 are grounded, while the lower electrode fingers thereof are coupled to unbalanced port 1403, so that this surface acoustic wave filter has the ports both unbalanced. However, the balanced port such as shown in FIG. 12 cannot be implemented because the second and third IDT electrodes are connected with the first IDT electrode by parts 1401, 1402, respectively.

In each of the above cases, the ratio of the spacing between the IDT electrodes to an electrode finger pitch of the IDT electrode is 1.5 or 0.5, and the periodic structure is discontinuous. Consequently, filter characteristics degrades due to, for example, bulk radiation of a surface acoustic wave.

DISCLOSURE OF THE INVENTION

A surface acoustic wave filter includes a piezoelectric substrate, and a plurality of interdigital transducer electrodes (IDT electrodes) and a plurality of reflector electrodes disposed on the piezoelectric substrate. Each of the IDT electrodes is an interdigital electrode including a plurality of opposed electrode fingers, and each of the reflector electrodes is formed of an arrangement of a plurality of electrode fingers. The IDT electrodes and the reflector electrodes are arranged in close relation along a propagation direction of a surface acoustic wave. The IDT electrode includes a primary excitation region having λ/2 electrode finger pitches, where λ is a wavelength of the surface acoustic wave. The primary excitation region of at least one of the IDT electrodes is phase-shifted from the primary excitation region of another IDT electrode by a certain amount in accordance with a desired passband frequency response. The IDT electrode includes at least one secondary excitation region having electrode finger pitches different from the λ/2 pitches, and/or at least one of the reflector electrodes includes electrode finger pitches different from the λ/2 pitches. The surface acoustic wave filter thus has a propagation path having reduced discontinuity and hence low-loss filter characteristics.

BEST MODE FOR CARRYING OUT THE INVENTION

First Exemplary Embodiment

Figure 1:
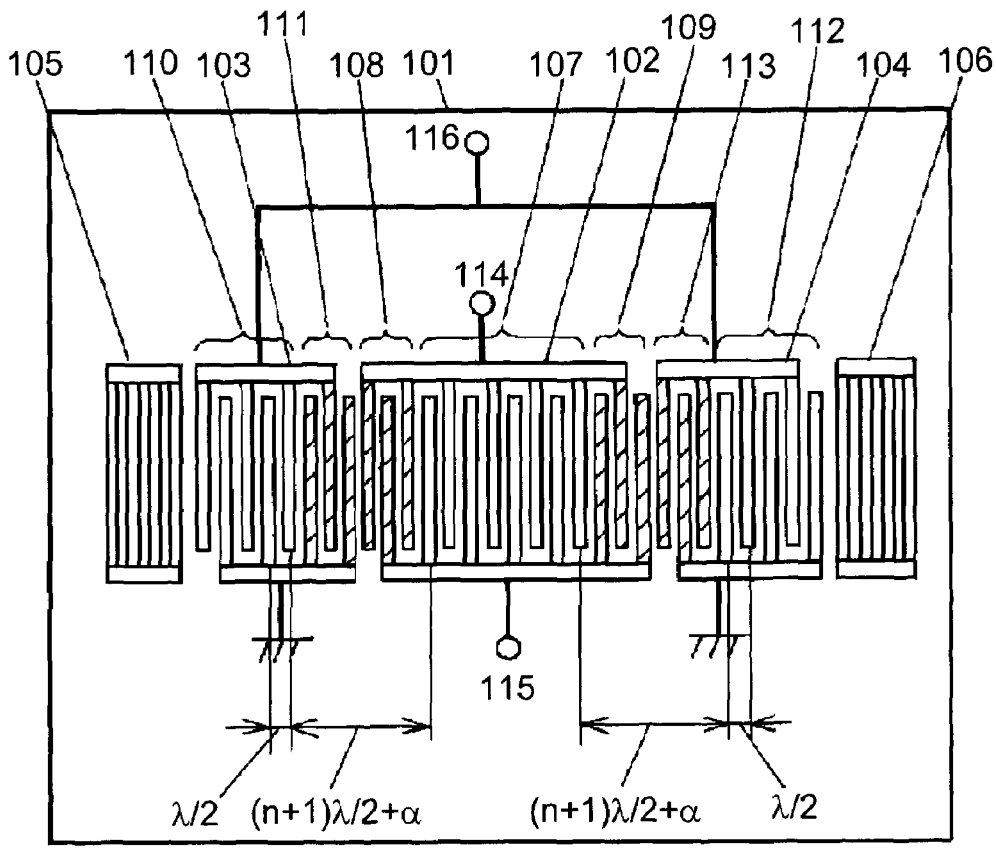
FIG. 1 illustrates a surface acoustic wave filter in accordance with a first exemplary embodiment of the present invention.

FIG. 1 schematically illustrates a surface acoustic wave filter in accordance with the first exemplary embodiment.

In FIG. 1, a pattern of interdigital electrodes each including opposed electrode fingers is formed on piezoelectric substrate 101, whereby a surface acoustic wave can be excited. The surface acoustic wave filter formed is a longitudinally coupled type including first, second and third IDT electrodes 102, 103, 104 and first and second reflector electrodes 105, 106 on piezoelectric substrate 101.

In the surface acoustic wave filter mentioned above, the upper electrode fingers of first IDT electrode 102 are coupled to first terminal 114 of a balanced port, while the lower electrode fingers of this IDT electrode 102 are coupled to second terminal 115 of the balanced port. The upper electrode fingers of second IDT electrode 103 are coupled to unbalanced port 116, while the lower electrode fingers thereof are grounded. Similarly, the upper electrode fingers of third IDT electrode 104 are coupled to unbalanced port 116, while the lower electrode fingers thereof are grounded. This surface acoustic wave filter thus includes the unbalanced and balanced ports.

First IDT electrode 102 is divided into three regions including first excitation region 107, second excitation region 108 and third excitation region 109.

In first IDT electrode 102, first excitation region 107 is located between second and third excitation regions 108, 109. Second IDT electrode 103 is divided into two regions including first excitation region 110 and second excitation region 111.

Second excitation region 111 of second IDT electrode 103 is located adjacent to first IDT electrode 102. Third IDT electrode 104 is divided into two regions including first excitation region 112 and second excitation region 113. Second excitation region 113 of third IDT electrode 104 is located adjacent to first IDT electrode 102.

First excitation regions 107, 110, 112 of first, second and third IDT electrodes 102, 103, 104 are referred to as primary excitation regions. Throughout these primary excitation regions, a spacing (hereinafter referred to as an electrode finger pitch) between respective centers of the adjacent electrode fingers is set at $\lambda/2$, where $\lambda$ is the wavelength of the surface acoustic wave to be excited. The second and third excitation regions in first, second and third IDT electrodes 102, 103, 104 are referred to as secondary excitation regions.

A spacing between an excitation center of first excitation region 107 of first IDT electrode 102 and an excitation center of first excitation region 110 of second IDT electrode 103 is deviated by amount $\alpha$ from the $\lambda/2$ periodic structure. Similarly, a spacing between the excitation center of first excitation region 107 of first IDT electrode 102 and an excitation center of first excitation region 112 of third IDT electrode 104 is deviated by amount a from the $\lambda/2$ periodic structure. In other words, the periodic arrangement of the electrode fingers in primary excitation region 110 of second IDT electrode 103 is phase-shifted by $\alpha$ from the periodic arrangement of the electrode fingers in primary excitation region 107 of first IDT electrode 102. Similarly, the periodic arrangement of the electrode fingers in primary excitation region 112 of third IDT electrode 104 is phase-shifted by a from the periodic arrangement of the electrode fingers in primary excitation region 107 of first IDT electrode 102.

Second and third excitation regions 108, 109 of first IDT electrode 102, second excitation region 111 of second IDT electrode 103 and second excitation region 113 of third IDT electrode 104 each have electrode finger pitches different from the $\lambda/2$ pitches. With the structure described above, the IDT electrode converts an electric signal, input from the unbalanced or balanced port, to the surface acoustic wave, which is confined between the reflector electrodes, so that a standing wave is generated on the piezoelectric substrate, and consequently, a plurality of resonance modes is formed. Value $\alpha$ is optimized so as to couple the primary and tertiary resonance modes together, whereby desired filter characteristics is obtained.

Referring to the accompanying drawings, a description is provided next of respective adjacent portions of first and third IDT electrodes 102, 104. FIG. 2 includes enlarged views each illustrating the respective adjacent portions of first and third IDT electrodes 102, 104 when deviating amount $\alpha=-\lambda/4$. In each of these cases, third excitation region 109 of first IDT electrode 102 and second excitation region 113 of third IDT electrode 104 each have three electrode fingers.

In each of these cases, the distance between centers of the respective fingers nearest to each other in first excitation regions 107, 112 of the first and third IDT electrodes is $7\lambda/2-\lambda/4$.

Figure 2A:
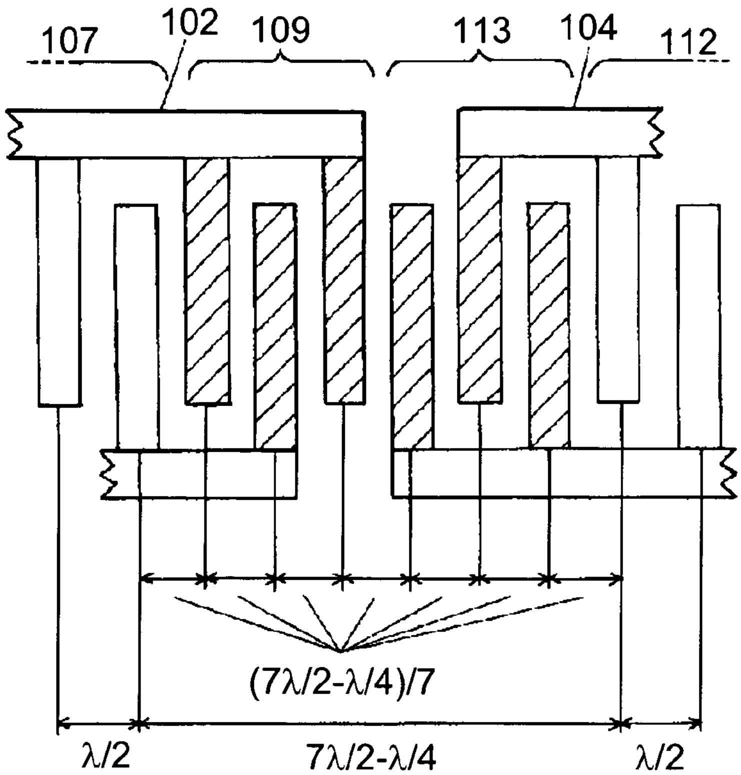
FIG. 2A is an enlarged view illustrating electrode fingers arranged at equal pitches in secondary excitation regions when the deviating amount is −λ/4.

FIG. 2A illustrates the electrode fingers arranged at equal pitches in excitation regions 109, 113 of first and third IDT electrodes 102, 104.

Since there are seven finger-to-finger spacings for the six electrode fingers, every electrode finger pitch is $(7\lambda/2-\lambda/4)/7$. Therefore, the ratio of the electrode finger pitch of first excitation region 107 to the electrode finger pitch of third excitation region 109 of first IDT electrode 102 as well as the ratio of the electrode finger pitch of first excitation region 112 to the electrode finger pitch of second excitation region 113 of third IDT electrode 104 is 0.929. Accordingly, the difference between the respective electrode finger pitches of first and third excitation regions 107, 109 as well as between the respective electrode finger pitches of first and second excitation regions 112, 113 is about 7%. Thus, a resulting structure has reduced discontinuity. The application of the same structure to the respective adjacent portions of first and second IDT electrodes 102, 103 allows the surface acoustic wave filter to have as a whole a substantially periodic structure having reduced discontinuity along a propagation direction.

Figure 2B:
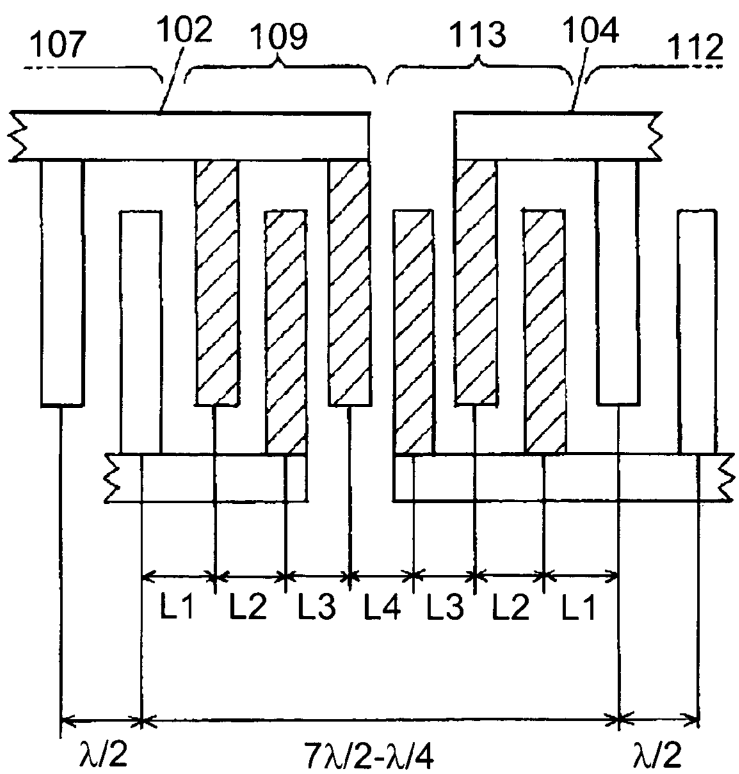
FIG. 2B is an enlarged view illustrating electrode fingers arranged at pitches varying stepwise in secondary excitation regions when the deviating amount is −λ/4.

FIG. 2B illustrates the electrode fingers arranged at pitches varying stepwise in excitation regions 109, 113 of first and third IDT electrodes 102, 104.

In this case, the discontinuity can be reduced by optimizing electrode finger pitches L1, L2, L3, L4. For example, setting $\lambda/2>L1>L2>L3>L4$ can reduce the discontinuity between the adjacent fingers.

If $L1=L2=L3=L4$ in FIG. 2B, this is similar to the structure illustrated by FIG. 2A.

If $L1=L2\neq L3=L4$ in FIG. 2B, excitation regions 109, 113 include two different kinds of electrode finger pitches. Even in this case, the discontinuity can be less than that of a conventional case, whereby bulk radiation loss can be reduced, and the filter can have reduced loss as a whole.

A description is provided next of cases where deviating amount $\alpha=+\lambda/4$. FIG. 3 includes enlarged views each illustrating the respective adjacent portions of first and third IDT electrodes 102, 104 when $\alpha=+\lambda/4$. In each of these cases, third excitation region 109 of first IDT electrode 102 and second excitation region 113 of third IDT electrode 104 each have three electrode fingers, and the distance between centers of the respective fingers nearest to each other in first excitation regions 107, 112 of the first and third IDT electrodes is $7\lambda/2+\lambda/4$.

Figure 3A:
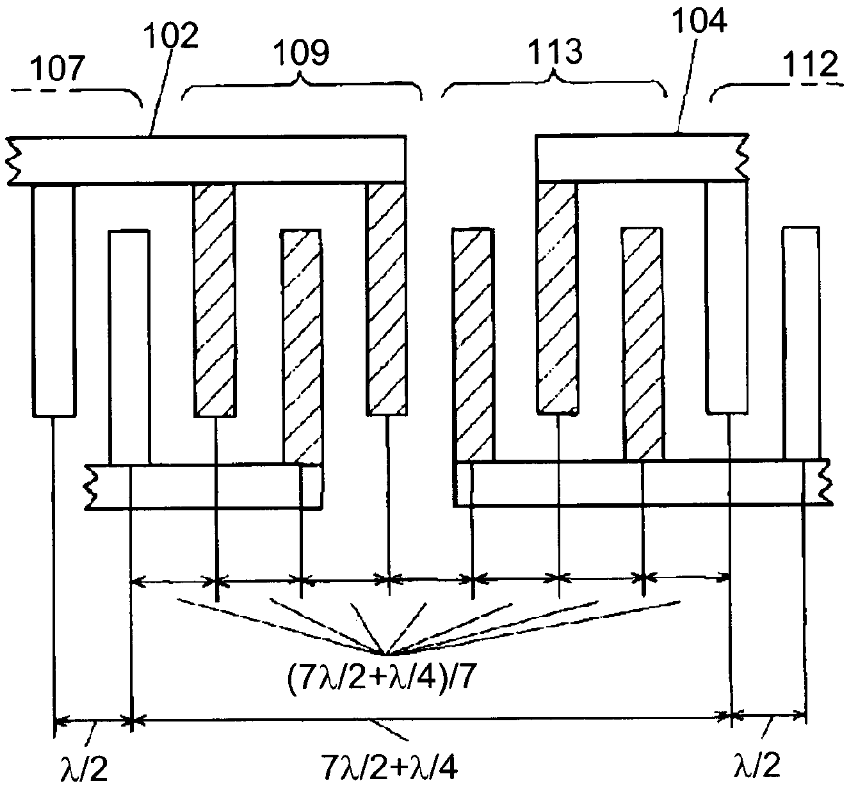
FIG. 3A is an enlarged view illustrating electrode fingers arranged at equal pitches in secondary excitation regions when the deviating amount is +λ/4.

FIG. 3A illustrates the electrode fingers arranged at equal pitches in excitation regions 109, 113 of the first and third IDT electrodes 102, 104.

Since there are seven finger-to-finger spacings for the six electrode fingers, every electrode finger pitch is $(7\lambda/2+\lambda/4)/7$. Therefore, the ratio of the electrode finger pitch of first excitation region 107 to the electrode finger pitch of third excitation region 109 of first IDT electrode 102 as well as the ratio of the electrode finger pitch of first excitation region 112 to the electrode finger pitch of second excitation region 113 of third IDT electrode 104 is 1.071. Accordingly, the difference between the respective electrode finger pitches of first and third excitation regions 107, 109 as well as between the respective electrode finger pitches of first and second excitation regions 112, 113 is about 7%. Thus, a resulting structure has reduced discontinuity.

The application of the same structure to the respective adjacent portions of first and second IDT electrodes 102, 103 allows the surface acoustic wave filter to have as a whole a substantially periodic structure having reduced discontinuity along the propagation direction.

Figure 3B:
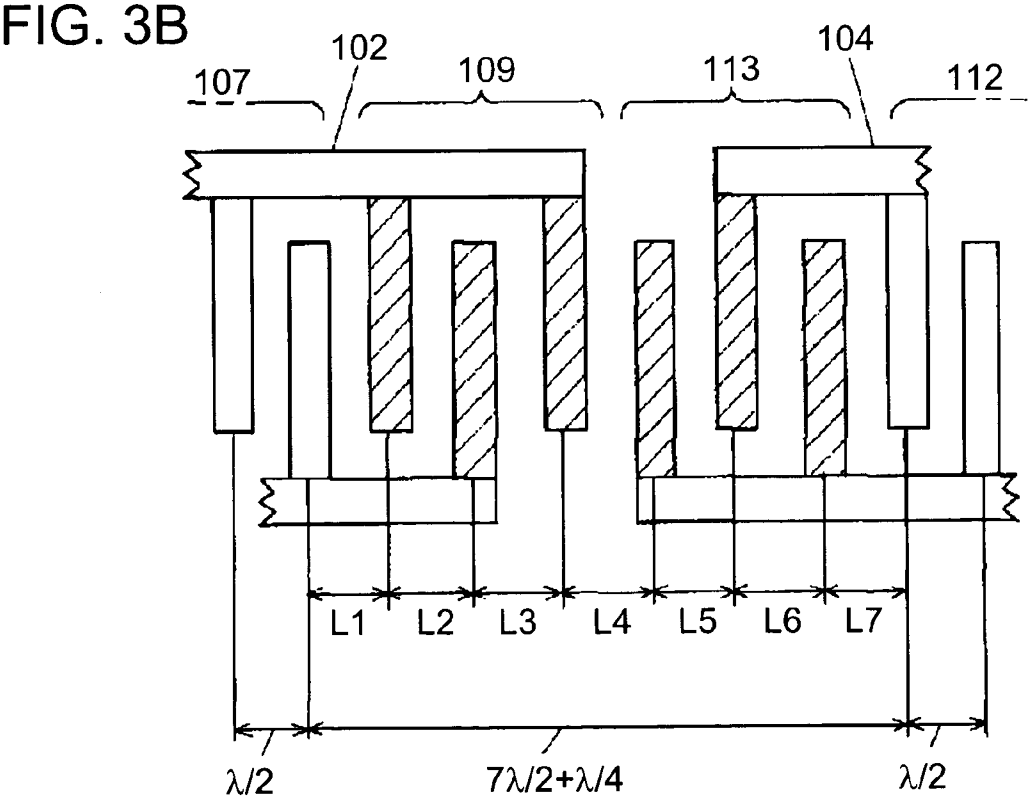
FIG. 3B is an enlarged view illustrating electrode fingers arranged at pitches varying stepwise in secondary excitation regions when the deviating amount is +λ/4.

FIG. 3B illustrates the electrode fingers arranged at pitches varying stepwise in excitation regions 109, 113 of first and third IDT electrodes 102, 104. In the case of FIG. 3B, the discontinuity can be reduced by optimizing electrode finger pitches L1, L2, L3, L4. For example, setting $\lambda/2<L1<L2<L3<L4$ can reduce the discontinuity between the adjacent fingers.

If $L1=L2=L3=L4$ in FIG. 3B, this is similar to the structure illustrated by FIG. 3A.

If $L1=L2\neq L3=L4$ in FIG. 3B, excitation regions 109, 113 include two different kinds of electrode finger pitches. Even in this case, the discontinuity can be less than that of the conventional case, whereby the bulk radiation loss can be reduced. Consequently, the filter can have reduced loss as a whole.

Next, a description is provided of cases where second and third excitation regions 108, 109 of first IDT electrode 102 each have n1 electrode fingers, while respective second excitation regions 111, 113 of second and third IDT electrodes 103, 104 each have n2 electrode fingers. It is to be noted here that first IDT electrode 102 has a total of N1 electrode fingers, while second and third IDT electrodes 103, 104 each have a total of N2 electrode fingers.

Figure 4:
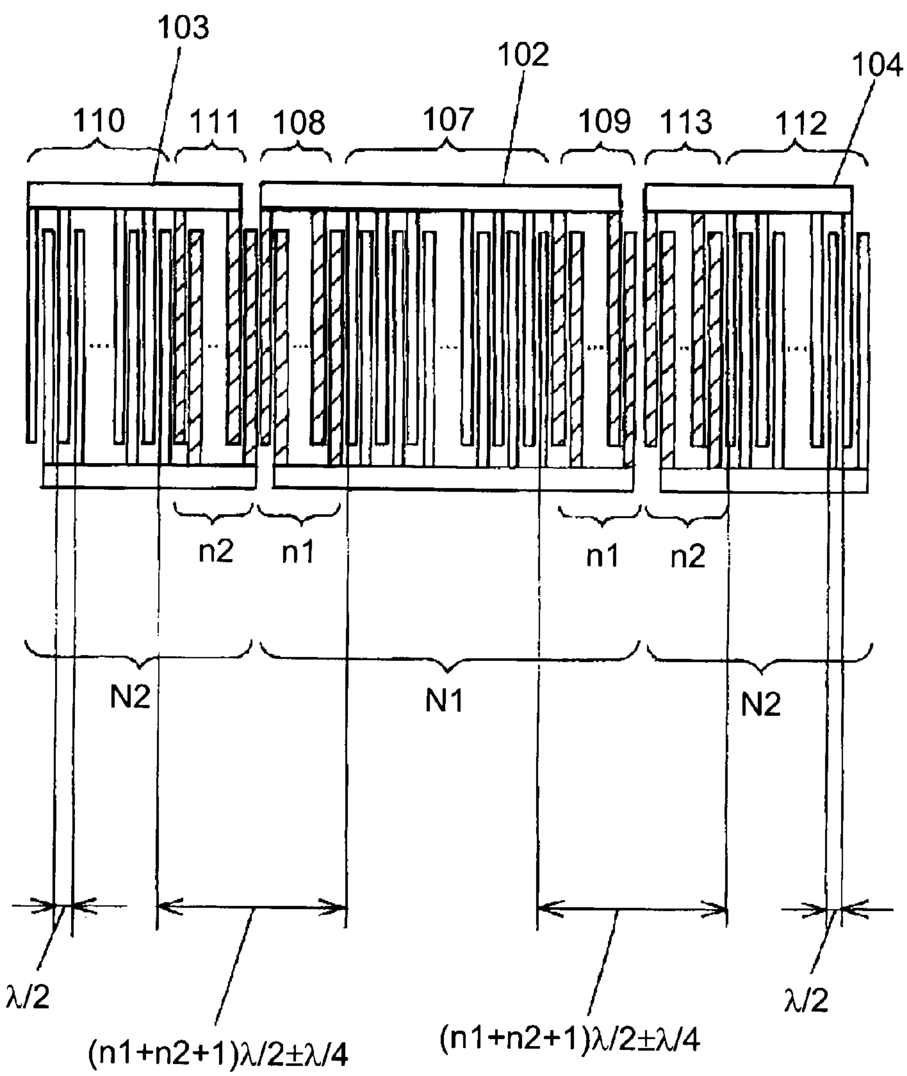
FIG. 4 illustrates a filter in accordance with the first embodiment of the present invention.

As shown in FIG. 4, the distance between centers of the respective fingers nearest to each other in first excitation regions 107, 110 of first and second IDT electrodes 102, 103 as well as between centers of the respective fingers nearest to each other in first excitation regions 107, 112 of first and third IDT electrodes 102, 104 is $(n1+n2+1)\lambda/2\pm\lambda4$. It is to be noted here that deviating amount $\alpha$ is equal to $+\lambda/4$ when there is "+" in front of $\lambda/4$ and $-\lambda/4$ when there is "−" in front of $\lambda/4$.

When the electrode fingers are arranged at equal pitches in excitation regions 108, 111 of first and second IDT electrodes 102, 103 as well as in excitation regions 109, 113 of first and third IDT electrodes 102, 104, there exist $(n1+n2+1)$ finger-to-finger spacings in excitation regions 108, 111 as well as in excitation regions 109, 113, so that every electrode finger pitch is $\{(n1+n2+1)\lambda/2+\lambda/4\}/(n1+n2+1)$. Therefore, the ratio of the electrode finger pitch of each of first excitation regions 107, 110, 112 of IDT electrodes 102, 103, 104 to the electrode finger pitch of each of excitation regions 108, 111, 109, 113 is $1\pm1/\{2(n1+n2+1)\}$.

With this structure, the discontinuity can be minimized, by appropriately selecting n1 and n2. The selection of n1 and n2 is determined by a trade-off between the discontinuity and the filter characteristics. In other words, the increase in n1 and n2 results in reduced discontinuity, but results in an unsatisfactory filter not having a desired passband frequency response because the number of electrode fingers, which determines a main part of the filter characteristics, in the first excitation region of each of the IDT electrodes decreases accordingly. Conversely, the decrease in n1 and n2 results in a filter having increased discontinuity and increased loss caused by bulk radiation or the like.

Figure 5A:
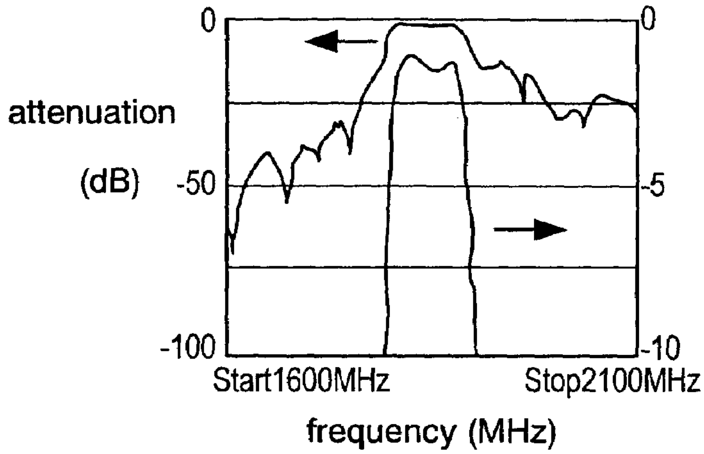
FIG. 5A shows filter characteristics when n1=n2=3.
Figure 5B:
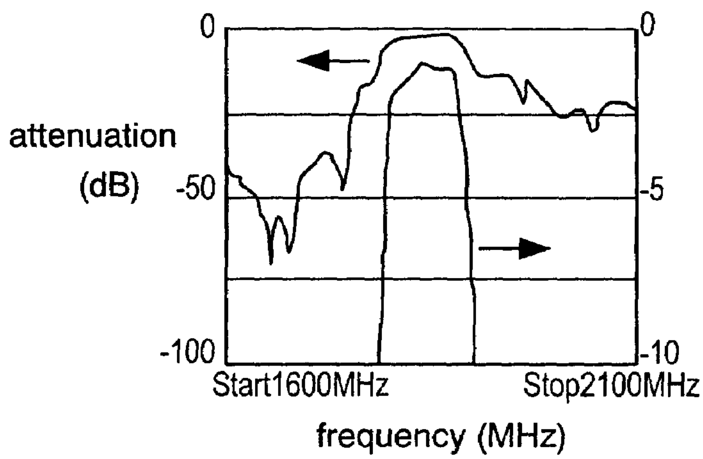
FIG. 5B shows filter characteristics when n1=n2=5.
Figure 5C:
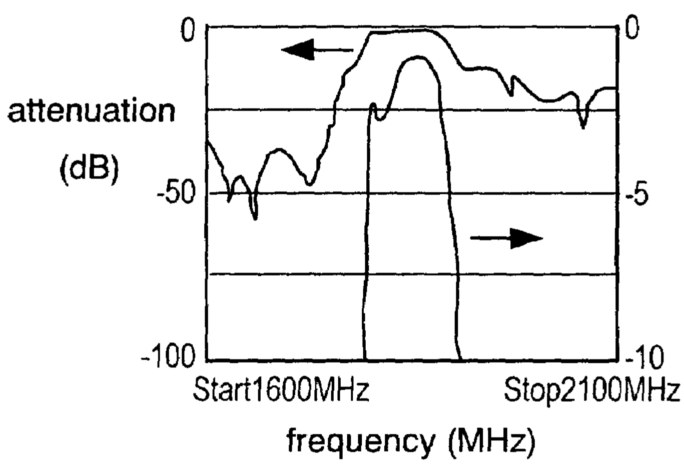
FIG. 5C shows filter characteristics when n1=n2=7.

FIGS. 5A–5C illustrate filter characteristics when n1 and n2 are varied. In each of these graphs, the vertical axis shows passing characteristics (attenuation characteristics) on two different scales.

Specifically, FIG. 5A illustrates the passing characteristics when $n1=n2=3$, FIG. 5B illustrates the passing characteristics when $n1=n2=5$, and FIG. 5C illustrates the passing characteristics when $n1=n2=7$. As can be seen from these drawings, as n1 and n2 increase, the attenuation increases accordingly. This is because the number of electrode fingers in each of first excitation regions 107, 110, 112 becomes smaller with respect to the number of electrode fingers in the secondary excitation region(s). In this case, the first IDT electrode has a total of 31 electrode fingers, and the second and third IDT electrodes each have a total of 19 electrode fingers.

Of the total number of electrode fingers of each of the second and third IDT electrodes, the number of electrode fingers in the second excitation region accounts for $(n2)/N2=3/19=0.158$ in the case of FIG. 5A, $(n2)/N2=5/19=0.263$ in the case of FIG. 5B, and $(n2)/N2=7/19=0.368$ in the case of FIG. 5C. Of the total number of electrode fingers of the first IDT electrode, the number of electrode fingers in the second and third excitation regions accounts for (n1+n1)/N1=(3+3)/31=0.194 in the case of FIG. 5A, (n1+n1)/N1=(5+5)/31=0.323 in the case of FIG. 5B, and (n1+n1)/N1=(7+7)/31=0.452 in the case of FIG. 5C.

As shown by FIGS. 5A–5C, the attenuation increases to a large extent when n1=n2=7. It is thus preferable that the number of electrode fingers in the secondary excitation region(s) accounts for ⅓ or less (i.e. (n1+n1)/N1<⅓ or (n2)/N2<⅓) of the total number of fingers of the IDT electrode.

Figure 6:
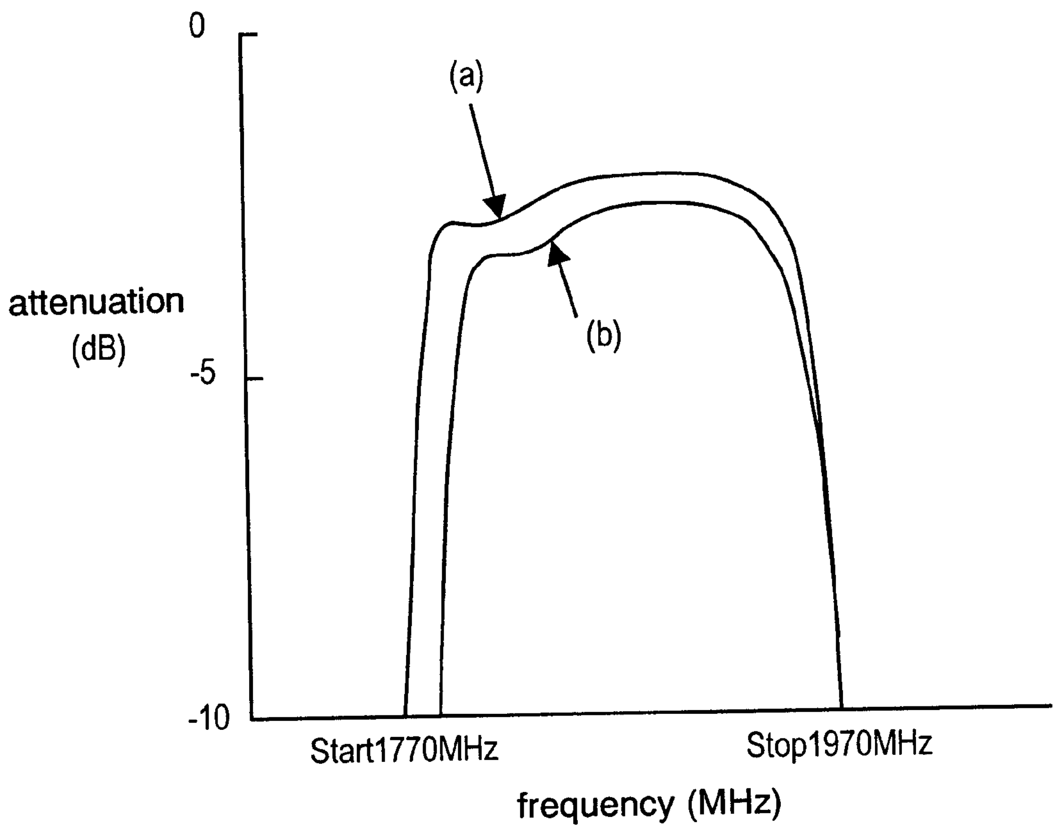
FIG. 6 shows measured characteristics of a filter when n1=n2=5 and measured characteristics of a conventional filter.

FIG. 6 shows measured characteristics (a) of a filter when n1=n2=5 and measured characteristics (b) of a conventional filter. As can be seen from FIG. 6, there is an improvement of 0.5 dB or more in loss.

As described above, deviating the first excitation regions of the first, second and third IDT electrodes by the certain amount affords the characteristics of the longitudinal mode surface acoustic wave filter using the primary and tertiary modes. Further, optimizing the electrode finger pitches of the secondary excitation regions of the first, second and third IDT electrodes reduces the discontinuity, so that all the electrode fingers form the substantially continuous periodic structure, thus reducing the loss caused by the bulk radiation resulting from discontinuity of acoustic impedance.

In the above description, the same number of electrode fingers is used in the secondary excitation region of each of the first, second and third IDT electrodes. However, the number of fingers in the secondary excitation region may be optimized according to the total number of fingers of each of the IDT electrodes. In other words, an optimum excitation condition can be obtained by making n1 differ from n2.

The first excitation region of the first IDT electrode is deviated by −λ/4 or +λ/4 from the respective first excitation regions of the second and third IDT electrodes. However, the deviating amount is not limited to these values. The deviating amount is one of parameters determining a passband of the filter and is therefore optimized in accordance with desired filter characteristics.

In the present embodiment, the surface acoustic wave filter is configured to have the unbalanced and balanced ports. In this structure, balancing characteristics of the balanced port becomes an essential parameter. The balancing characteristics can be improved by, for example, slightly increasing distance L4 between first IDT electrode 102 coupled to the balanced port and each of IDT electrodes 103, 104 coupled to the unbalanced port such that λ/2>L1=L2=L3<L4 in FIG. 2B. Although the increase in L4 results in the slight decrease in each of electrode finger pitches L1, L2, L3 in this case, the losscan be reduced as a result of reduced discontinuity, and the balancing characteristics can be improved as long as the ratio between the adjacent electrode finger pitches of the IDT electrode ranges from 0.8 to 1.2. An ideal balancing characteristics can be obtained when a signal input from unbalanced port 116 and output to first terminal 114 of the balanced port and a signal input from unbalanced port 116 and output to second terminal 115 of the balanced port are of the same amplitude and oppositely phased. The balancing characteristics practically deviates from an ideal value due to, for example, a parasitic component between the IDT electrodes. However, the balancing characteristics can be improved by changing the parasitic component between the IDT electrodes through adjustment of the electrode finger pitches.

The present embodiment has referred to the electrode finger pitch only. In addition to the electrode finger pitch, a metallization ratio (the ratio of an electrode finger width to the finger-to-finger spacing) can be changed, too. For example, since the electrode finger pitch of secondary excitation regions 109, 113 is smaller than the electrode finger pitch of primary excitation regions 107, 112 in FIG. 2A, setting the metallization ratio of secondary excitation regions 109, 113 larger than that of primary excitation regions 107, 112 can bring the electrode finger width of the secondary excitation regions close to the electrode finger width of the primary excitation regions. With the electrode finger pitch and the metallization ratio thus taken into account for reduced discontinuity, the loss can be reduced further.

As long as the electrode finger pitches of the surface acoustic wave filter are set to define the periodic structure of the present invention, the similar advantages can be obtained even when the input/output direction is reversed.

The present embodiment has referred to the balanced and unbalanced ports. However, the ports may both be unbalanced or balanced. The similar advantages can be obtained even when the input/output direction is reversed as long as the electrode finger pitches of the surface acoustic wave filter are set to define the periodic structure of the present invention.

The application of the present invention to a filter using a leaky surface acoustic wave can enhance the effect of reducing the bulk radiation loss. With the leaky surface acoustic wave, the proportion of the bulk radiation loss generally increases in wave mode conversion due to the presence of discontinuity, so that the filter is likely to have increased loss as a whole. However, the application of the present invention can reduce the bulk radiation loss.

Second Exemplary Embodiment

Figure 7A:
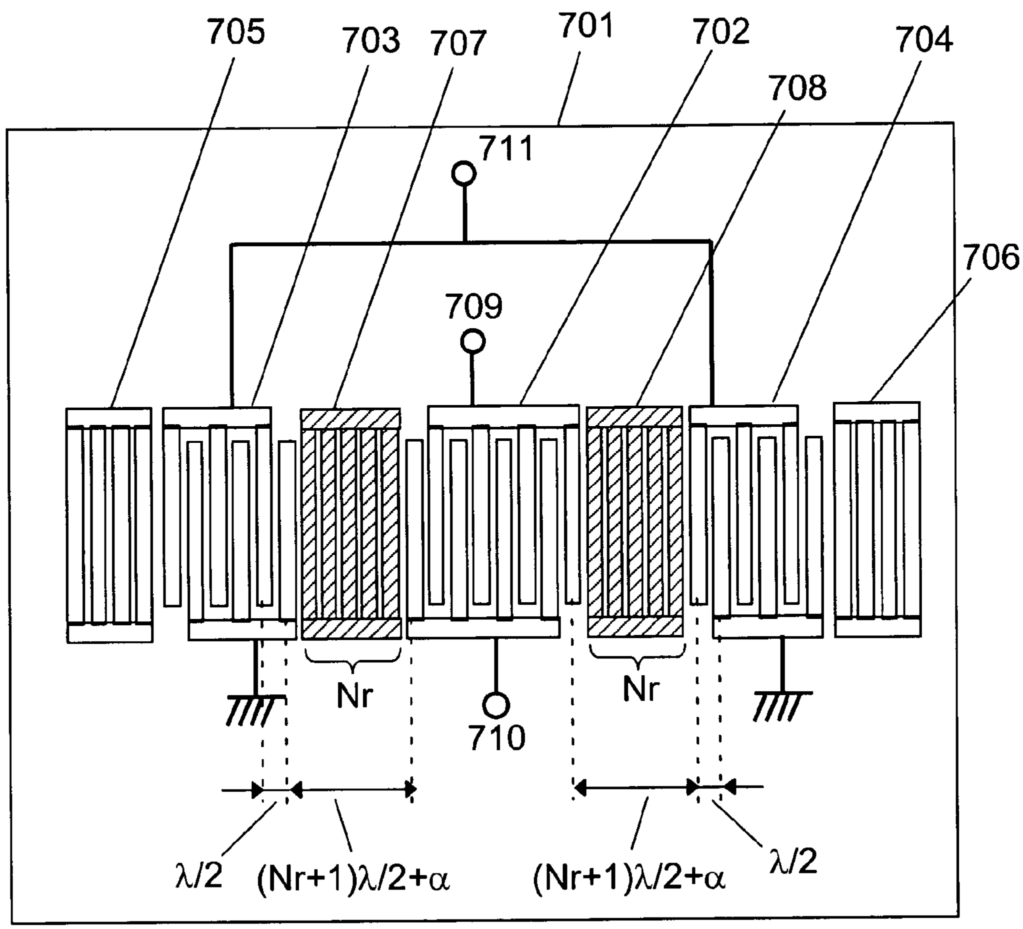
FIG. 7A illustrates a surface acoustic wave filter in accordance with a second exemplary embodiment of the present invention.

FIG. 7A schematically illustrates a surface acoustic wave filter in accordance with the second exemplary embodiment of the present invention.

In FIG. 7A, a pattern of interdigital electrodes each constructed of opposed electrode fingers is formed on piezoelectric substrate 701, whereby a surface acoustic wave is excited.

The surface acoustic wave filter formed is a longitudinally coupled type including first, second and third IDT electrodes 702, 703, 704 and first, second, third and fourth reflector electrodes 707, 708, 705, 706 on piezoelectric substrate 701.

The second embodiment of this invention differs from the first embodiment in that first reflector electrode 707 is disposed between first and second IDT electrodes 702, 703 and that second reflector electrode 708 is disposed between first and third IDT electrodes 702, 704. This arrangement can reduce discontinuity of a periodic structure defined by electrode finger pitches and can hence reduce loss of the surface acoustic wave filter. Third and fourth reflector electrodes 705, 706 of the present embodiment are similar in structure to respective reflector electrodes 105, 106 of the first embodiment.

In the above-mentioned surface acoustic wave filter, the upper electrode fingers of first IDT electrode 702 are coupled to first terminal 709 of a balanced port, while the lower electrode fingers of this IDT electrode 702 are coupled to second terminal 710 of the balanced port. The upper electrode fingers of second IDT electrode 703 are coupled to unbalanced port 711, while the lower electrode fingers thereof are grounded. Similarly, the upper electrode fingers of the third IDT electrode are coupled to unbalanced port 711, while the lower electrode fingers thereof are grounded. This surface acoustic wave filter thus includes the unbalanced and balanced ports.

Throughout IDT electrodes 702, 703, 704, the electrode finger pitch is set at λ/2. A spacing between an excitation center of first IDT electrode 702 and an excitation center of second IDT electrode 703 is deviated by amount α from the λ/2 periodic structure. Similarly, a spacing between the excitation center of first IDT electrode 702 and an excitation center of third IDT electrode 704 is deviated by amount α from the λ/2 periodic structure.

A description is now provided of a case where the deviating amount is −λ/4. When the number of electrode fingers of each of the first and second reflector electrodes is Nr, the distance between centers of the respective fingers nearest to each other in first and second IDT electrodes 702, 703 as well as centers of the respective fingers nearest to each other in first and third IDT electrodes 702, 704 is $\{(Nr+1)\lambda/2-\lambda/4\}$.

In cases where the electrode fingers of each of first and second reflector electrodes 707, 708 are arranged at equal pitches, every electrode finger pitch of these reflector electrodes 707, 708 is $\{(Nr+1)\lambda/2-\lambda/4\}/(Nr+1)$ because there exist (Nr+1) finger-to-finger spacings in each of these reflector electrodes 707, 708. Therefore, the ratio of the electrode finger pitch of each of IDT electrodes 702, 703, 704 to the electrode finger pitch of each of reflector electrodes 707, 708 is $1-1/\{2(Nr+1)\}$. With reflector electrodes 707, 708 each having four or more electrode fingers, every electrode finger pitch of reflector electrodes 707, 708 is 0.9λ/2 or more, and the discontinuity can be limited to within 10%.

In cases where the deviating amount is +λ/4, the ratio of the electrode finger pitch of each of IDT electrodes 702, 703, 704 to the electrode finger pitch of each of reflector electrodes 707, 708 is $1+1/\{2(Nr+1)\}$. With reflector electrodes 707, 708 each having four or more electrode fingers, every electrode finger pitch of reflector electrodes 707, 708 is 1.1λ/2 or less, and the discontinuity can be limited to within 10%.

In the present embodiment, the electrode fingers of first and second reflector electrodes 707, 708 are arranged at equal pitches. However, those electrode fingers may be arranged at pitches varying stepwise such as noted in the first embodiment, or the reflector electrode may have two or more different kinds of electrode finger pitches.

Figure 7B:
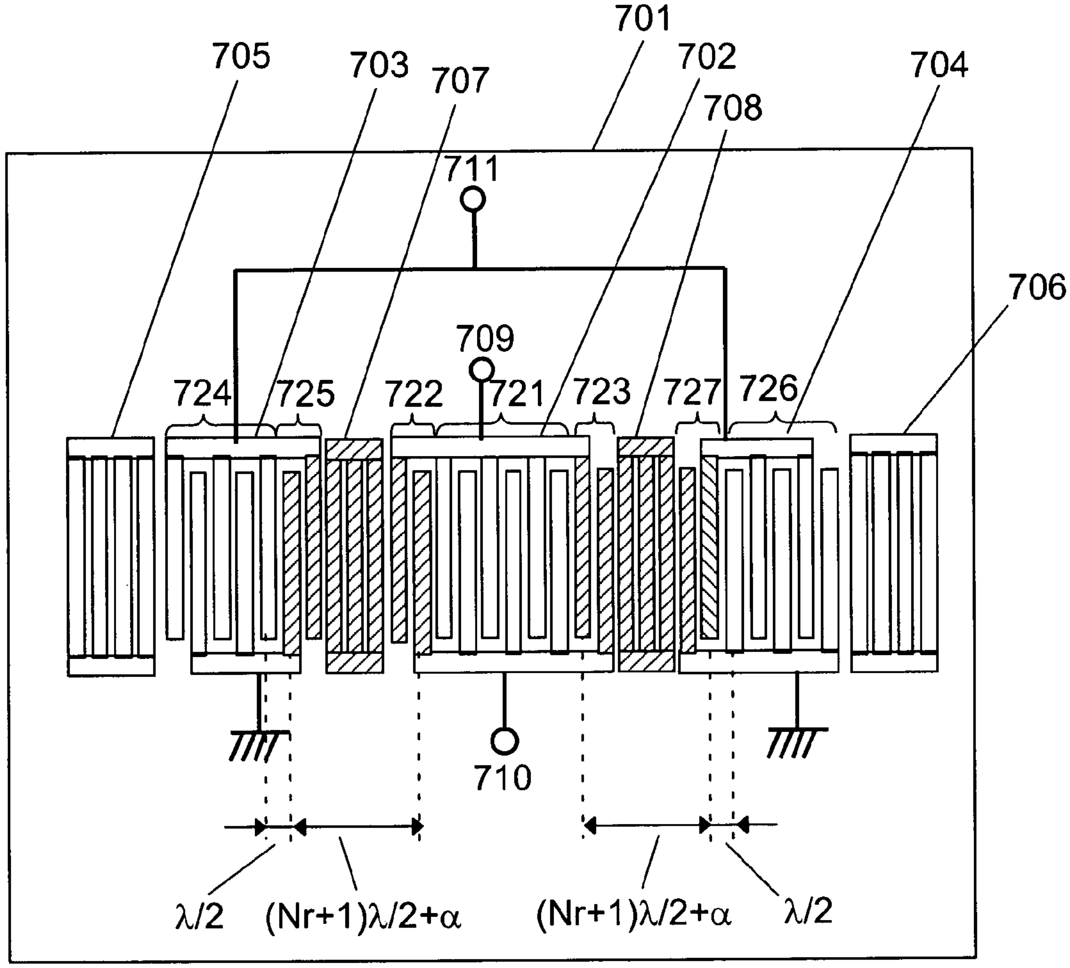
FIG. 7B illustrates another surface acoustic wave filter in accordance with the second embodiment.

The electrode finger pitches of first and second reflector electrodes 707, 708 differ from those of first, second and third IDT electrodes 702, 703, 704. However, IDT electrodes 702, 703, 704 may each be divided into a plurality of regions to change the electrode finger pitches of each region adjacent to reflector electrode 707 or 708. As shown in FIG. 7B, first IDT electrode 702 is divided into three regions including first excitation region 721, second excitation region 722 and third excitation region 723. In first IDT electrode 702, first excitation region 721 is located between second and third excitation regions 722, 723. Second IDT electrode 703 is divided into two regions including first excitation region 724 and second excitation region 725. Second excitation region 725 of second IDT electrode 703 is located close to first IDT electrode 702. Third IDT electrode 704 is divided into two regions including first excitation region 726 and second excitation region 727. Second excitation region 727 of third IDT electrode 704 is located close to first IDT electrode 702.

Throughout first excitation regions 721, 724, 726 of IDT electrodes 702, 703, 704, a spacing (electrode finger pitch) between respective centers of the adjacent electrode fingers is set at λ/2, where λ is the wavelength of the surface acoustic wave to be excited.

A spacing between an excitation center of first excitation region 721 of first IDT electrode 702 and an excitation center of first excitation region 724 of second IDT electrode 703 is deviated by a certain amount from the λ/2 periodic structure. Similarly, a spacing between the excitation center of first excitation region 721 of first IDT electrode 702 and an excitation center of first excitation region 726 of third IDT electrode 704 is deviated by the certain amount from the λ/2 periodic structure. In other words, optimizing the electrode finger pitches of first and second reflector electrodes 707, 708 and the electrode finger pitches of regions 722, 723, 725, 727 of the IDT electrodes as a whole affords the similar advantages.

The number of electrode fingers of the reflector electrode and the number of fingers of the IDT electrode are not limited specifically and are optimized for desired filter characteristics. Also the reflector electrodes shown in FIGS. 7A and 7B may be grounded.

The surface acoustic wave filter of the present embodiment is configured to have the balanced and unbalanced ports, so that if, similarly to the first embodiment, the ratio between the adjacent electrode finger pitches ranges from 0.8 to 1.2 in consideration of an advantage obtained by improving balancing characteristics, the loss can be reduced as a result of reduced discontinuity, and the balancing characteristics can be improved.

The first IDT electrode is deviated by −λ/4 or +λ/4 from the second and third IDT electrodes. However, the deviating amount is not limited to these values. The deviating amount is one of parameters determining a passband of the filter and is therefore optimized in accordance with the desired filter characteristics.

The present embodiment has referred to the electrode finger pitch only. As in the first embodiment, in addition to the electrode finger pitch, a metallization ratio of the electrode finger can be changed, too.

The present embodiment has referred to the balanced and unbalanced ports. However, the ports may both be unbalanced or balanced.

As long as the electrode finger pitches of the surface acoustic wave filter are set to define the periodic structure of the present invention, the similar advantages can be obtained even when an input/output direction is reversed.

The application of the present invention to a filter using a leaky surface acoustic wave can enhance the effect of reducing bulk radiation loss.

Third Exemplary Embodiment

Figure 8:
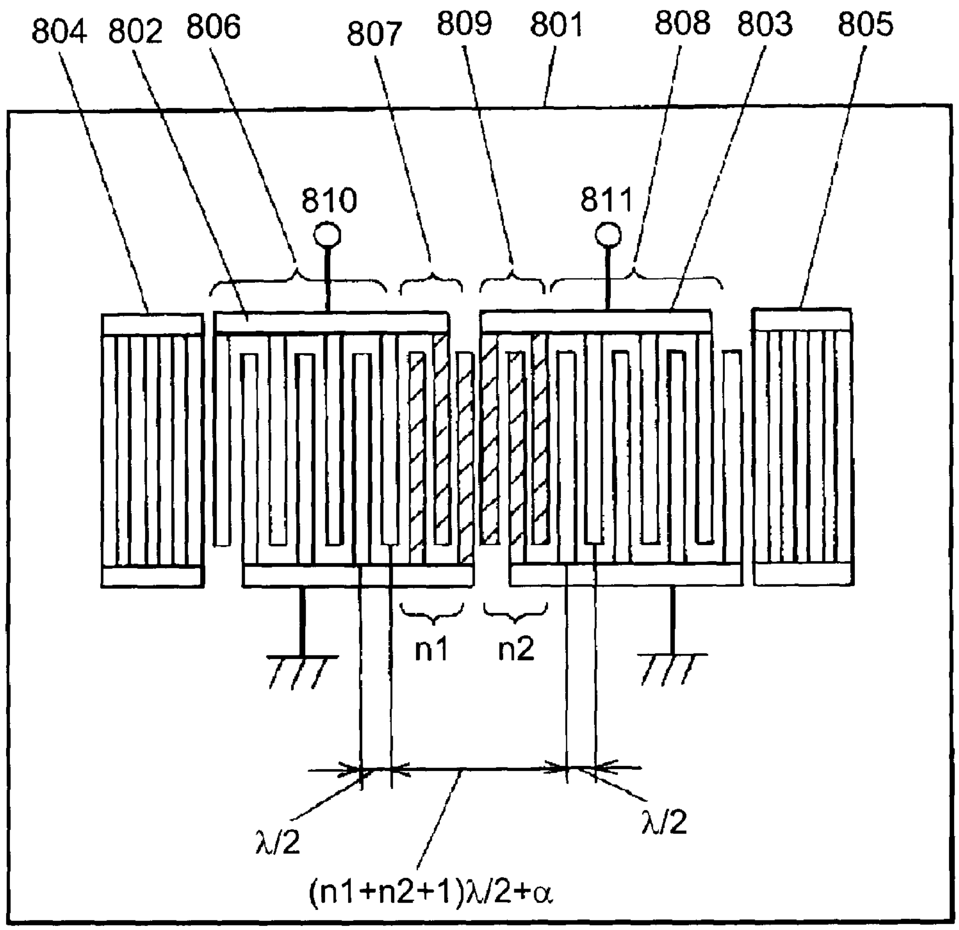
FIG. 8 illustrates a surface acoustic wave filter in accordance with a third exemplary embodiment of the present invention.

FIG. 8 schematically illustrates a surface acoustic wave filter in accordance with the third exemplary embodiment of the present invention.

In FIG. 8, a pattern of interdigital electrodes each constructed of opposed electrode fingers is formed on piezoelectric substrate 801, whereby a surface acoustic wave can be excited. The surface acoustic wave filter formed is a longitudinal mode type including first and second IDT electrodes 802, 803 and first and second reflector electrodes 804, 805 on piezoelectric substrate 801.

The third embodiment of this invention differs from the first embodiment in that the surface acoustic wave filter has the two IDT electrodes. This can reduce discontinuity of a periodic structure defined by electrode finger pitches, and can hence reduce loss of the surface acoustic wave filter.

In the above-mentioned surface acoustic wave filter, the upper electrode fingers of first IDT electrode 802 are coupled to unbalanced port 810, while the lower electrode fingers of this IDT electrode 802 are grounded. The upper electrode fingers of second IDT electrode 803 are coupled to unbalanced port 811, while the lower electrode fingers thereof are grounded. This surface acoustic wave filter thus includes the ports both unbalanced.

First IDT electrode 802 is divided into two regions including first excitation region 806 and second excitation region 807. Second excitation region 807 of this IDT electrode 802 is located adjacent to second IDT electrode 803.

Similarly, second IDT electrode 803 is divided into two regions including first excitation region 808 and second excitation region 809. Second excitation region 809 of this IDT electrode 803 is located adjacent to first IDT electrode 802.

Throughout first excitation regions 806, 808 of first and second IDT electrodes 802, 803, the electrode finger pitch is set at λ/2. A spacing between an excitation center of first excitation region 806 of first IDT electrode 802 and an excitation center of first excitation region 808 of second IDT electrode 803 is deviated by amount α from the λ/2 periodic structure. In first IDT electrode 802, the electrode finger pitch of first excitation region 806 differs from each electrode finger pitch of second excitation region 807 so that the ratio between these electrode finger pitches ranges from 0.9 to 1.2.

In second IDT electrode 803, the electrode finger pitch of first excitation region 808 differs from each electrode finger pitch of second excitation region 809 so that the ratio between these electrode finger pitches ranges from 0.9 to 1.2. In other words, all the electrode finger pitches of the surface acoustic wave filter range from 0.9λ/2 to 1.2λ/2 to define a substantially periodic structure.

A description is now provided of a case where second excitation regions 807, 809 of IDT electrodes 802, 803 have n1 electrode fingers and n2 electrode fingers, respectively. When deviating amount α=−λ/4, the distance between centers of the respective fingers nearest to each other in first excitation regions 806, 808 of first and second IDT electrodes 802, 803 is {(n1+n2+1)λ/2−λ/4}. In cases where the electrode fingers of second excitation regions 807, 809 of IDT electrodes 802, 803 are arranged at equal pitches, there exist (n1+n2+1) finger-to-finger spacings in these regions 807, 809, so that every electrode finger pitch of these regions 807, 809 is {(n1+n2+1)λ/2−λ/4}/(n1+n2+1). Therefore, the ratio of the electrode finger pitch of first excitation region 806 to the electrode finger pitch of second excitation region 807 of first IDT electrode 802 as well as the ratio of the electrode finger pitch of first excitation region 808 to the electrode finger pitch of second excitation region 809 of second IDT electrode 803 is 1−1/{2(n1+n2+1)}.

With the sum (n1+n2) of electrode fingers in second excitation regions 807, 809 of IDT electrodes 802, 803 being four or more, every electrode finger pitch of these regions 807, 809 is 0.9λ/2 or more, and the discontinuity can be limited to within 10%.

When the deviating amount is +λ/4, the ratio of the electrode finger pitch of the primary excitation region to the electrode finger pitch of the secondary excitation region is 1+1/{2(n1+n2+1)}.

With the sum (n1+n2) of electrode fingers in second excitation regions 807, 809 of IDT electrodes 802, 803 being four or more, every electrode finger pitch of these regions 807, 809 is 1.1λ/2 or less, and the discontinuity can be limited to within 10%.

In the present embodiment, the electrode fingers of second excitation regions 807, 809 of first and second IDT electrodes 802, 803 are arranged at equal pitches. However, those electrode fingers may be arranged at pitches varying stepwise such as noted in the first embodiment, or second excitation regions 807, 809 may each include two or more different kinds of electrode finger pitches different from the λ/2 pitches.

The first excitation region of the first IDT electrode is deviated by −λ/4 or +λ/4 from the first excitation region of second IDT electrode. However, the deviating amount is not limited to these values. The deviating amount is one of parameters determining a passband of the filter and is therefore optimized in accordance with desired filter characteristics.

The present embodiment has referred to the electrode finger pitch only. As in the first embodiment, in addition to the electrode finger pitch, a metallization ratio of the electrode finger can be changed, too.

The present embodiment has referred to the ports both unbalanced. However, the ports may not necessarily be unbalanced.

As long as the electrode finger pitches of the surface acoustic wave filter are set to define the periodic structure of the present invention, the similar advantages can be obtained even when an input/output direction is reversed.

The application of the present invention to a filter using a leaky surface acoustic wave can enhance the effect of reducing bulk radiation loss.

Fourth Exemplary Embodiment

Figure 9:
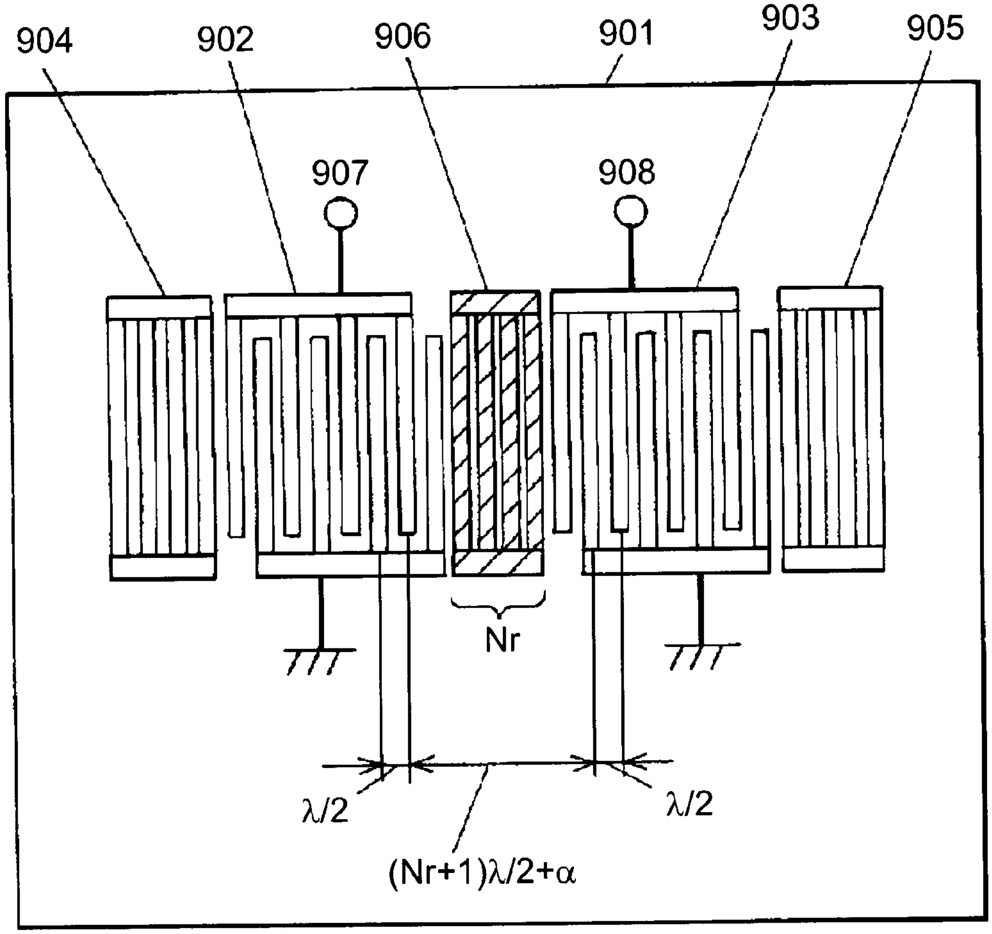
FIG. 9 illustrates a surface acoustic wave filter in accordance with a fourth exemplary embodiment of the present invention.

FIG. 9 schematically illustrates a surface acoustic wave filter in accordance with the fourth exemplary embodiment.

In FIG. 9, a pattern of interdigital electrodes each constructed of opposed electrode fingers is formed on piezoelectric substrate 901, whereby a surface acoustic wave can be excited. The surface acoustic wave filter formed is a longitudinal mode type including first and second IDT electrodes 902, 903 and first, second and third reflector electrodes 904, 905, 906 on piezoelectric substrate 901.

The fourth embodiment differs from the third embodiment in that third reflector electrode 906 is disposed between first and second IDT electrodes 902, 903. This can reduce discontinuity of a periodic structure defined by electrode finger pitches and can hence reduce loss of the surface acoustic wave filter.

In the above-mentioned surface acoustic wave filter, the upper electrode fingers of first IDT electrode 902 are coupled to unbalanced port 907, while the lower electrode fingers of this IDT electrode 902 are grounded. The upper electrode fingers of second IDT electrode 903 are coupled to unbalanced port 908, while the lower electrode fingers thereof are grounded. This surface acoustic wave filter thus includes the ports both unbalanced.

Throughout first and second IDT electrodes 902, 903, the electrode finger pitch is set at λ/2. A spacing between an excitation center of first IDT electrode 902 and an excitation center of second IDT electrode 903 is deviated by a certain amount from the periodic structure. A description is now provided of a case where the deviating amount is −λ/4. When the number of electrode fingers of the third reflector electrode is Nr, the distance between centers of the respective fingers nearest to each other in IDT electrodes 902, 903 is {(Nr+1)λ/2−λ/4}. In cases where the electrode fingers of third reflector electrode 906 are arranged at equal pitches, there exist (Nr+1) finger-to-finger spacings in this reflector electrode 906, so that every electrode finger pitch of this reflector electrode 906 is {(Nr+1)λ/2−λ/4}/(Nr+1).

Therefore, the ratio of the electrode finger pitch of each of IDT electrodes 902, 903 to the electrode finger pitch of third reflector electrode 906 is 1−1/{2(Nr+1)}. With third reflector electrode 906 having four or more electrode fingers, every electrode finger pitch of this reflector electrode 906 is 0.9λ/2 or more, and the discontinuity can be limited to within 10%.

In cases where the deviating amount is +λ/4, the ratio of the electrode finger pitch of each of IDT electrodes 902, 903 to the electrode finger pitch of third reflector electrode 906 is 1+1/{2(Nr+1)}. With reflector electrode 906 having four or more electrode fingers, every electrode finger pitch of this reflector electrode 906 is 1.1λ/2 or less, and the discontinuity can be limited to within 10%.

In the present embodiment, the electrode fingers of third reflector electrode 906 are arranged at equal pitches. However, those electrode fingers may be arranged at pitches varying stepwise such as noted in the first embodiment.

The electrode finger pitches of third reflector electrode 906 differ from those of first and second IDT electrodes 902, 903. However, IDT electrodes 902, 903 may each be divided into a plurality of regions to change the electrode finger pitches of each region adjacent to reflector electrode 906. In other words, optimizing the electrode finger pitches of this reflector electrode and the electrode finger pitches of the regions adjacent to this reflector electrode as a whole affords the similar advantages.

The first IDT electrode is deviated by −λ/4 or +λ/4 from the second IDT electrode. However, the deviating amount is not limited to these values. The deviating amount is one of parameters determining a passband of the filter and is therefore optimized in accordance with desired filter characteristics.

The present embodiment has referred to the electrode finger pitch only. As in the first embodiment, in addition to the electrode finger pitch, a metallization ratio of the electrode finger can be changed, too.

The present embodiment has referred to the ports both unbalanced. However, the ports may not necessarily be unbalanced.

The application of the present invention to a filter using a leaky surface acoustic wave can enhance the effect of reducing bulk radiation loss.

Further, as long as the electrode finger pitches of the surface acoustic wave filter are set to define the periodic structure of the present invention, the similar advantages can be obtained even when an input/output direction is reversed.

Fifth Exemplary Embodiment

Figure 10:
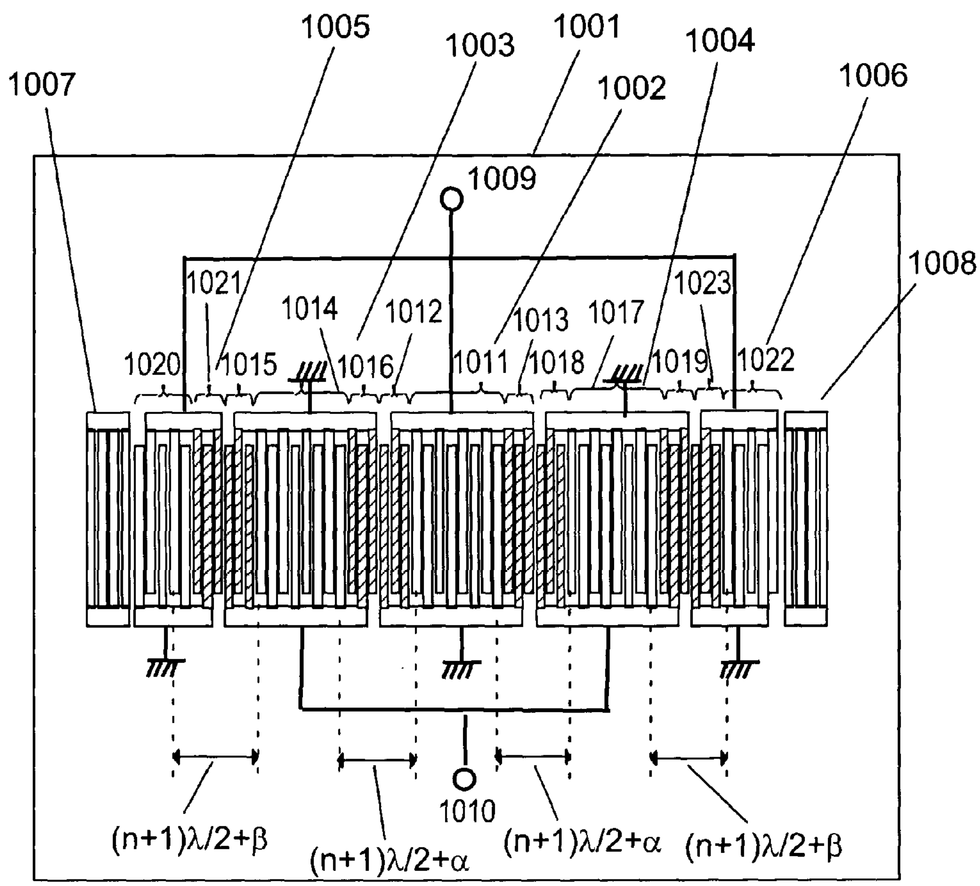
FIG. 10 illustrates a surface acoustic wave filter in accordance with a fifth exemplary embodiment of the present invention.

FIG. 10 schematically illustrates a surface acoustic wave filter in accordance with the fifth exemplary embodiment.

In FIG. 10, a pattern of interdigital electrodes each constructed of opposed electrode fingers is formed on piezoelectric substrate 1001, whereby a surface acoustic wave can be excited. The surface acoustic wave filter formed is a longitudinally coupled type including first, second, third, fourth and fifth IDT electrodes 1002, 1003, 1004, 1005, 1006 and first and second reflector electrodes 1007, 1008 on piezoelectric substrate 1001.

In the above-mentioned surface acoustic wave filter, the upper electrode fingers of first, fourth and fifth IDT electrodes 1002, 1005, 1006 are coupled to unbalanced port 1009, while the lower electrode fingers of these IDT electrodes 1002, 1005, 1006 are grounded. The lower electrode fingers of second and third IDT electrodes 1003, 1004 are coupled to unbalanced port 1010, while the upper electrode fingers thereof are grounded. The surface acoustic wave filter thus includes five IDT electrodes and the ports both unbalanced.

First IDT electrode 1002 is divided into three regions including first excitation region 1011, second excitation region 1012 and third excitation region 1013. In this IDT electrode 1002, first excitation region 1011 is located between second and third excitation regions 1012, 1013.

Second IDT electrode 1003 is divided into three regions including first excitation region 1014, second excitation region 1015 and third excitation region 1016. In this IDT electrode 1003, first excitation region 1014 is located between second and third excitation regions 1015, 1016.

Third IDT electrode 1004 is divided into three regions including first excitation region 1017, second excitation region 1018 and third excitation region 1019. In this IDT electrode 1004, first excitation region 1017 is located between second and third excitation regions 1018, 1019.

Fourth IDT electrode 1005 is divided into two regions including first excitation region 1020 and second excitation region 1021. Second excitation region 1021 of this IDT electrode 1005 is located adjacent to second IDT electrode 1003.

Fifth IDT electrode 1006 is divided into two regions including first excitation region 1022 and second excitation region 1023. Second excitation region 1023 of this IDT electrode 1006 is located adjacent to third IDT electrode 1004.

Throughout first excitation regions 1011, 1014, 1017, 1020, 1022 of first through fifth IDT electrodes 1002, 1003, 1004, 1005, 1006, a spacing (an electrode finger pitch) between respective centers of the adjacent electrode fingers is set at λ/2, where λ is the wavelength of the surface acoustic wave to be excited.

A spacing between an excitation center of first excitation region 1011 of first IDT electrode 1002 and an excitation center of first excitation region 1014 of second IDT electrode 1003 is deviated by amount α from the λ/2 periodic structure. Similarly, a spacing between the excitation center of first excitation region 1011 of first IDT electrode 1002 and an excitation center of first excitation region 1017 of third IDT electrode 1004 is deviated by amount α from the λ/2 periodic structure.

A spacing between the excitation center of first excitation region 1014 of second IDT electrode 1003 and an excitation center of first excitation region 1020 of fourth IDT electrode 1005 is deviated by amount β from the λ/2 periodic structure. Similarly, a spacing between the excitation center of first excitation region 1017 of third IDT electrode 1004 and an excitation center of first excitation region 1022 of fifth IDT electrode 1006 is deviated by amount β from the λ/2 periodic structure.

As noted in the above-described configuration, deviating the first excitation regions of the first through fifth IDT electrodes by the certain amount affords characteristics representative of the longitudinal mode surface acoustic wave filter using a plurality of modes. Further, optimizing the electrode finger pitches of the regions (secondary excitation regions) other than the first excitation regions of the first through fifth IDT electrodes reduces discontinuity, so that all the electrode fingers form a substantially continuous periodic structure, thus reducing loss caused by bulk radiation resulting from discontinuity of acoustic impedance.

The deviating amount of the first excitation region is set at α or β. However, the deviating amount is optimized in accordance with desired filter characteristics since the deviating amount is one of parameters determining a passband of the filter.

In the present embodiment, each area having the electrode finger pitches different from the λ/2 pitches may be formed of a reflector electrode or a combination of the reflector electrode and the secondary excitation regions of the IDT electrodes, as described in the second embodiment.

The present embodiment has referred to the ports both unbalanced. However, at least one of the ports may be balanced.

Sixth Exemplary Embodiment

Figure 11:
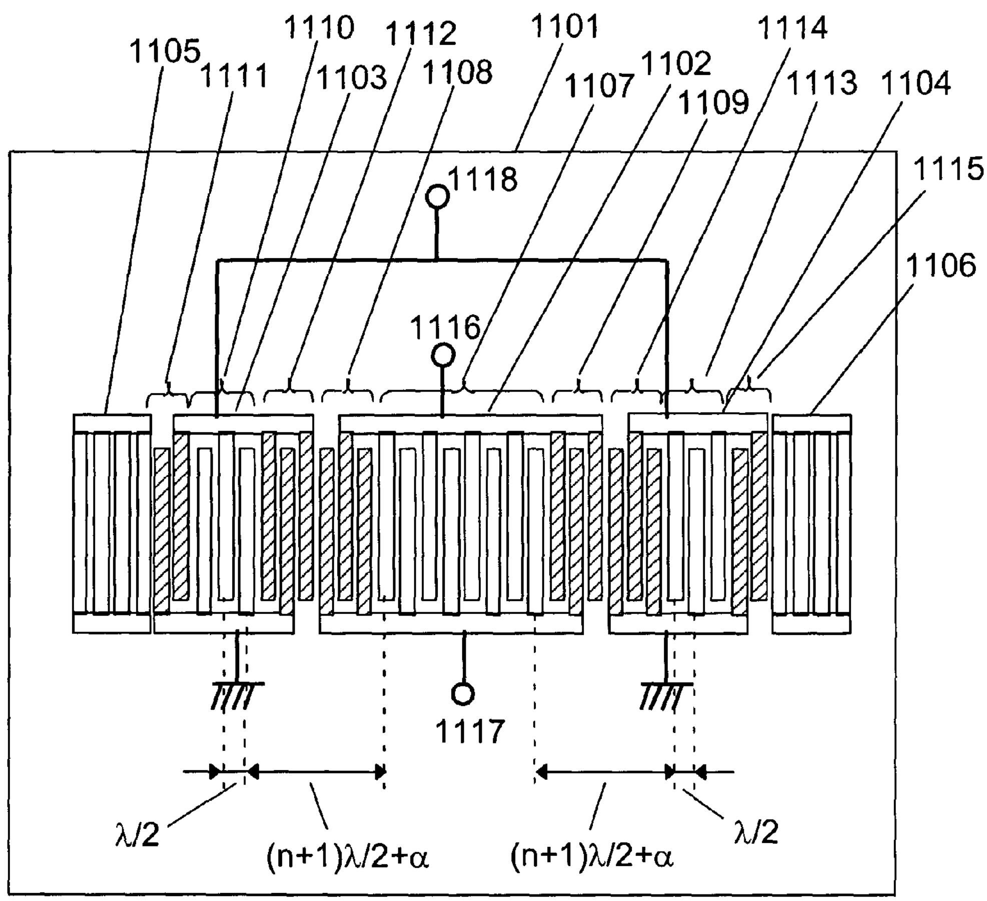
FIG. 11 illustrates a surface acoustic wave filter in accordance with a sixth exemplary embodiment of the present invention.
Figure 12:
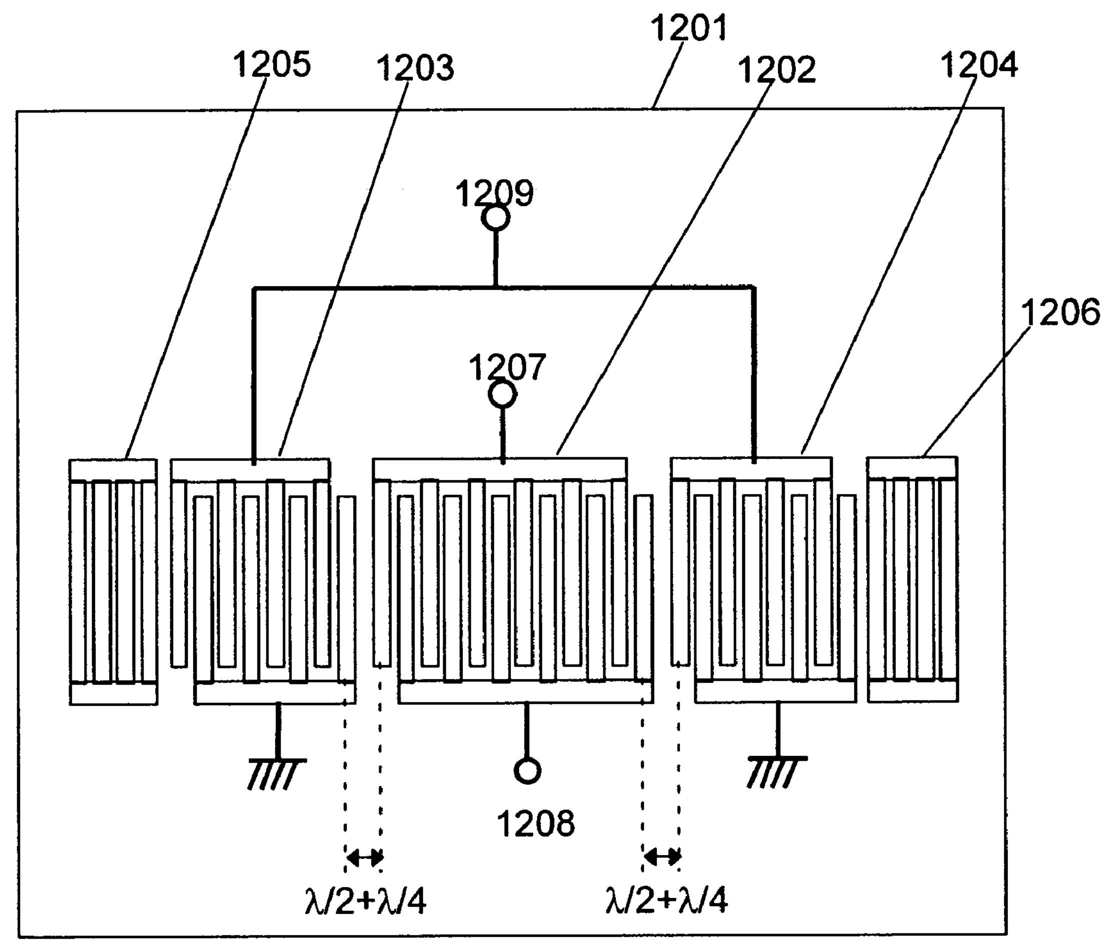
FIG. 12 illustrates a conventional surface acoustic wave filter.
Figure 13:
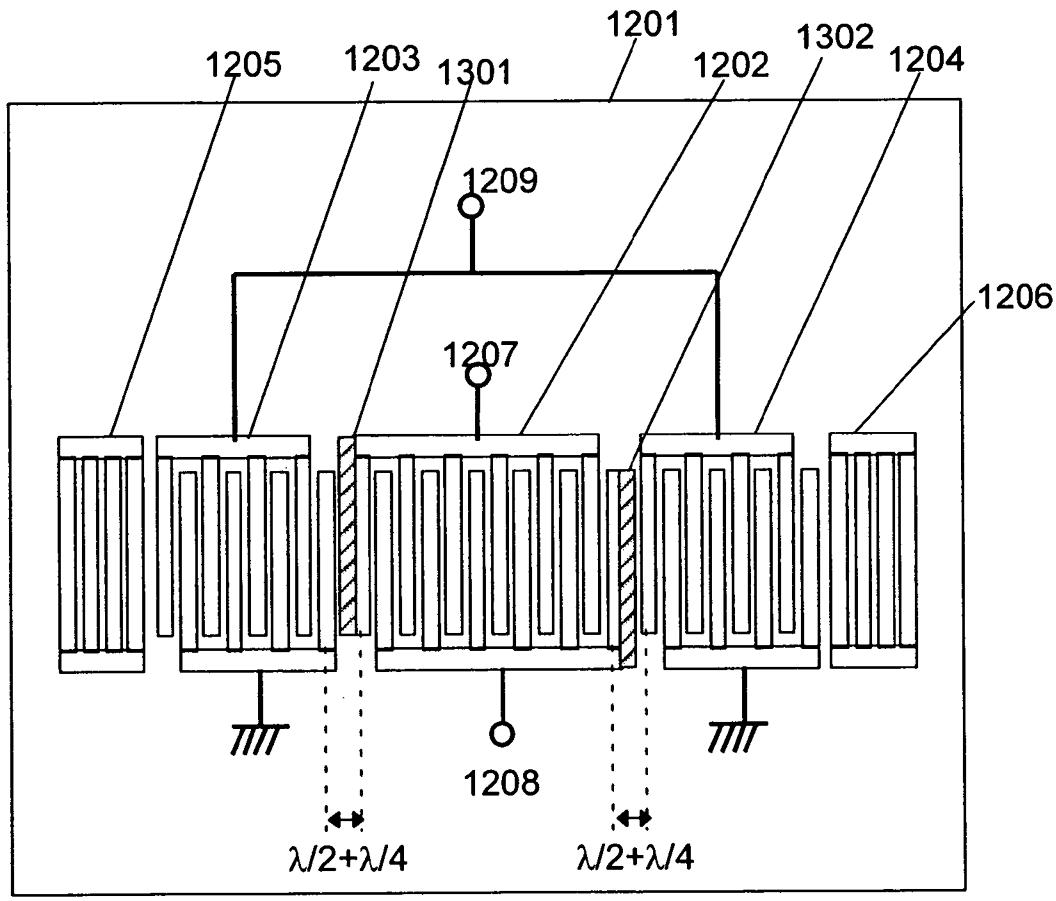
FIG. 13 illustrates another conventional surface acoustic wave filter.
Figure 14:
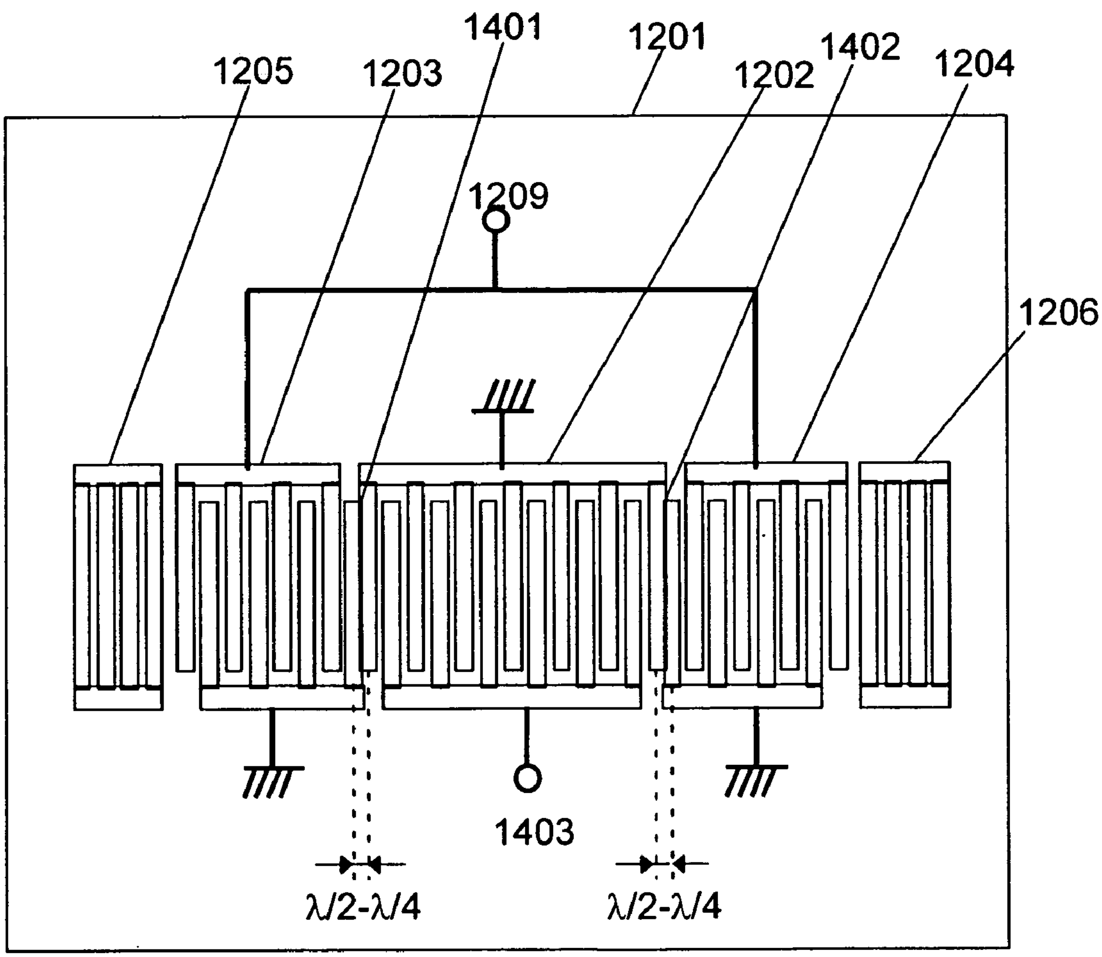
FIG. 14 illustrates still another conventional surface acoustic wave filter.

FIG. 11 schematically illustrates a surface acoustic wave filter in accordance with the sixth exemplary embodiment.

In FIG. 11, a pattern of interdigital electrodes each constructed of opposed electrode fingers is formed on piezoelectric substrate 1101, whereby a surface acoustic wave can be excited. The surface acoustic wave filter formed is a longitudinally coupled type including first, second and third IDT electrodes 1102, 1103, 1104 and first and second reflector electrodes 1105, 1106 on piezoelectric substrate 1101.

In the above-mentioned surface acoustic wave filter, the upper electrode fingers of first IDT electrode 1102 are coupled to first terminal 1116 of a balanced port, while the lower electrode fingers of this IDT electrode 1102 are coupled to second terminal 1117 of the balanced port. The upper electrode fingers of second IDT electrode 1103 are coupled to unbalanced port 1118, while the lower electrode fingers thereof are grounded. Similarly, the upper electrode fingers of third IDT electrode 1104 are coupled to unbalanced port 1118, while the lower electrode fingers thereof are grounded. This surface acoustic wave filter thus includes the unbalanced and balanced ports.

First IDT electrode 1102 is divided into three regions including first excitation region 1107, second excitation region 1108 and third excitation region 1109. In this IDT electrode 1102, first excitation region 1107 is located between second and third excitation regions 1108, 1109.

Second IDT electrode 1103 is divided into three regions including first excitation region 1110, second excitation region 1111 and third excitation region 1112. In this IDT electrode 1103, first excitation region 1110 is located between second and third excitation regions 1111, 1112, and second excitation region 1111 is located adjacent to first reflector electrode 1105.

Third IDT electrode 1104 is divided into three regions including first excitation region 1113, second excitation region 1114 and third excitation region 1115. In this IDT electrode 1104, first excitation region 1113 is located between second and third excitation regions 1114, 1115, and third excitation region 1115 is located adjacent to second reflector electrode 1106.

Throughout first excitation regions 1107, 1110, 1113 of IDT electrodes 1102, 1103, 1104, a spacing (an electrode finger pitch) between respective centers of the adjacent electrode fingers is set at λ/2, where λ is the wavelength of the surface acoustic wave to be excited.

A spacing between an excitation center of first excitation region 1107 of first IDT electrode 1102 and an excitation center of first excitation region 1110 of second IDT electrode 1103 is deviated by amount a from the λ/2 periodic structure. Similarly, a spacing between the excitation center of first excitation region 1107 of first IDT electrode 1102 and an excitation center of first excitation region 1113 of third IDT electrode 1104 is deviated by amount a from the λ/2 periodic structure.

The reflector electrodes have electrode finger pitches different from those of first excitation regions 1107, 1110, 1113 of IDT electrodes 1102, 1103, 1104. The excitation center of first excitation region 1110 of the second IDT electrode is deviated by a certain amount from a reflection center of first reflector electrode 1105. Similarly, the excitation center of first excitation region 1113 of the third IDT electrode is deviated by a certain amount from a reflection center of second reflector electrode 1106. The deviating amounts are optimized in accordance with a passband frequency response.

Here, the distance between the excitation center of first excitation region 1110 of the second IDT electrode and the reflection center of first reflector electrode 1105, and the distance between the excitation center of first excitation region 1113 of the third IDT electrode and the reflection center of second reflector electrode 1106 are optimized by setting electrode finger pitches different from the λ/2 pitches throughout second and third excitation regions 1111, 1115 of second and third IDT electrodes 1103, 1104. This can reduce discontinuity and also reduce discontinuity that results when the electrode finger pitches of the reflector electrodes differ from those of first excitation regions 1107, 1110, 1113 of IDT electrodes 1102, 1103, 1104.

As noted in the above-described configuration, deviating the first excitation regions of the first, second and third IDT electrodes by the certain amount affords characteristics representative of the longitudinal mode surface acoustic wave filter using primary and tertiary modes. Further, optimizing the electrode finger pitches of the regions other than the first excitation regions of the first, second and third IDT electrodes reduces the discontinuity, so that all the electrode fingers form a substantially continuous periodic structure, thus reducing loss caused by bulk radiation resulting from discontinuity of acoustic impedance.

The description has referred to the unbalanced and balanced ports. However, the ports may both be unbalanced.

In the present embodiment, all of the secondary excitation regions of the IDT electrodes and the reflector electrodes have the electrode finger pitches different from the λ/2 pitches. However, the electrode finger pitches of reflector electrodes 1105, 1106 and the regions of the IDT electrodes that are adjacent to respective reflector electrodes 1105, 1106 may be the only finger pitches different from the λ/2 pitches.

The present embodiment may be applied to not only the filter including the three IDT electrodes but also filters including those, such as described in the third, fourth and fifth embodiments, which include two IDT electrodes and five IDT electrodes, respectively and a filter having IDT electrodes to the number other than two, three and five. With such an IDT electrode structure also, by optimizing electrode finger pitches to reduce discontinuity of the propagation path, the similar advantages can be obtained.

In each of the foregoing embodiments, some of the electrode finger pitches of the IDT electrode or the electrode finger pitches of the reflector electrode are set different from the λ/2 pitches for reduced discontinuity. However, both the reflector electrode and the IDT electrode may include the electrode finger pitches different from the λ/2 pitches for reduced discontinuity.

INDUSTRIAL APPLICABILITY

The present invention proposes a structure for minimizing discontinuity between IDT electrodes in a surface acoustic wave filter in which a region having λ/2 electrode finger pitches of at least one IDT electrode is phase-shifted from that of other IDT electrode by a certain amount in accordance with a desired passband frequency response, and as a result realizes a low loss surface acoustic wave filter. By adopting this surface acoustic wave filter, a sensitivity of a high-frequency apparatus such as a mobile communication apparatus can be improved.

What is claimed is:

1. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches is disposed between two of the IDT electrodes is established, the plurality of IDT electrodes includes a first IDT electrode and a second IDT electrode adjacent to the first IDT electrode, the reflector electrodes include a first reflector electrode adjacent to the first IDT electrode and a second reflector electrode adjacent to the second IDT electrode, the respective primary excitation regions of the first and second IDT electrodes are phase-shifted from each other by the certain amount in accordance with the desired passband frequency response, and the first and second IDT electrodes include, on the respective adjacent sides of the first and second IDT electrodes, respective secondary excitation regions each having the electrode finger pitches different from the λ/2 pitches, wherein the electrode finger pitches of at least one of the secondary excitation regions are all equal.

2. The surface acoustic wave filter according to claim 1, wherein all of the electrode finger pitches of the surface acoustic wave filter fall within a range of 0.8λ/2 to 1.2λ/2.

3. The surface acoustic wave filter according to claim 1, wherein the surface acoustic wave is a leaky surface acoustic wave.

4. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches is disposed between two of the IDT electrodes is established, the plurality of IDT electrodes includes a first and second IDT electrodes, at least one of the reflector electrodes is disposed between the first and second IDT electrodes, the respective primary excitation regions of the first and second IDT electrodes are phase-shifted from each other by the certain amount in accordance with the desired passband frequency response, and the at least one reflector electrode has electrode finger pitches different from the λ/2 pitches, wherein the electrode finger pitches of the at least one reflector electrode include two or more different kinds of electrode finger pitches.

5. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches IS disposed between two of the IDT electrodes is established, the plurality of IDT electrodes includes a first and second IDT electrodes, at least one of the reflector electrodes is disposed between the first and second IDT electrode, the respective primary excitation regions of the first and second IDT electrodes are phase-shifted from each other by the certain amount in accordance with the desired passband frequency response, and the at least one reflector electrode has electrode finger pitches different from the λ/2 pitches, wherein the electrode finger pitches of the reflector electrode differ from one another and increase stepwise.

6. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches is disposed between two of the IDT electrodes is established, the plurality of IDT electrodes includes a first, second and third IDT electrodes, the plurality of reflector electrodes includes a first and second reflector electrodes, the second IDT electrode is located on a first side of the first IDT electrode across the first reflector electrode, the third IDT electrode is located on a second side of the first IDT electrode across the second reflector electrode, the primary excitation region of the first IDT electrode is phase-shifted from the respective primary excitation regions of the second and third IDT electrodes by the certain amount in accordance with the desired passband frequency response, and each of the first and second reflector electrodes has electrode finger pitches different from the λ/2 pitches, wherein the electrode finger pitches of at least one of the first and second reflector electrodes include two or more different kinds of electrode finger pitches.

7. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches is disposed between two of the IDT electrodes is established, the plurality of IDT electrodes includes a first, second and third IDT electrodes, the plurality of reflector electrodes includes a first and second reflector electrodes, the second IDT electrode is located on a first side of the first IDT electrode across the first reflector electrode, the third IDT electrode is located on a second side of the first IDT electrode across the second reflector electrode, the primary excitation region of the first IDT electrode is phase-shifted from the respective primary excitation regions of the second and third IDT electrodes by the certain amount in accordance with the desired passband frequency response, and each of the first and second reflector electrodes has electrode finger pitches different from the λ/2 pitches, wherein the electrode finger pitches of at least one of the first and second reflector electrodes differ from one another and increase stepwise.

8. A longitudinally coupled surface acoustic wave filter comprising:

a piezoelectric substrate; and a plurality of interdigital transducer electrodes (IDT electrodes) and a plurality of reflector electrodes disposed on the piezoelectric substrate, wherein each of the IDT electrodes is an interdigital electrode including a plurality of opposed electrode fingers, wherein the IDT electrodes and the reflector electrodes are arranged in close relation along a propagation direction of a surface acoustic wave, wherein each of the IDT electrodes includes a primary excitation region having λ/2 electrode finger pitches, where λ is a wavelength of the surface acoustic wave, wherein the primary excitation region of at least one of the IDT electrodes is phase-shifted from the primary excitation region of another IDT electrode by a certain amount in accordance with a desired passband frequency response, and wherein at least one of a condition that at least one of the IDT electrodes includes, on a side thereof adjacent to another IDT electrode, a secondary excitation region having electrode finger pitches different from the λ/2 pitches, and a condition that at least one of the reflector electrodes having electrode finger pitches different from the λ/2 pitches is disposed between two of the IDT electrodes is established, wherein:

the plurality of IDT electrodes includes at least five IDT electrodes, the plurality of reflector electrodes includes at least four reflector electrodes each disposed between two of the IDT electrodes, the primary excitation region of one of the IDT electrodes is phase-shifted from the primary excitation region of another of the IDT electrode by the certain amount in accordance with the desired passband frequency response, and at least one of the reflector electrodes has electrode finger pitches different from the λ/2 pitches.

9. The surface acoustic wave filter according to claim 8, wherein the electrode finger pitches of the at least one reflector electrode include two or more different kinds of electrode finger pitches.

10. The surface acoustic wave filter according to claim 8, wherein the electrode finger pitches of the at least one reflector electrode differ from one another and increase stepwise.

* * * * *